(12) United States Patent
Tamlyn

(10) Patent No.: US 8,630,141 B2
(45) Date of Patent: Jan. 14, 2014

(54) CIRCUITS AND METHODS FOR PROVIDING REFRESH ADDRESSES AND ALTERNATE REFRESH ADDRESSES TO BE REFRESHED

(75) Inventor: Robert Tamlyn, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 13/016,657

(22) Filed: Jan. 28, 2011

(65) Prior Publication Data
US 2012/0195149 A1    Aug. 2, 2012

(51) Int. Cl.
*G11C 7/00*    (2006.01)

(52) U.S. Cl.
USPC ............... 365/222; 365/230.02; 365/230.06; 365/226

(58) Field of Classification Search
USPC .................. 365/222, 230.06, 230.02, 226
See application file for complete search history.

(56) References Cited

U.S. PATENT DOCUMENTS

| | | | |
|---|---|---|---|
| 6,075,744 A * | 6/2000 | Tsern et al. | 365/230.03 |
| 6,741,515 B2 * | 5/2004 | Lazar et al. | 365/222 |
| 6,876,592 B2 * | 4/2005 | Takahashi et al. | 365/222 |
| 6,912,169 B2 * | 6/2005 | Choi | 365/222 |
| 6,940,773 B2 | 9/2005 | Poechmueller | 365/222 |
| 7,116,602 B2 | 10/2006 | Klein | |
| 7,184,352 B2 | 2/2007 | Klein et al. | 365/222 |
| 7,193,918 B2 | 3/2007 | Harrand et al. | 365/222 |
| 7,272,066 B2 | 9/2007 | Klein | |
| 7,277,345 B2 | 10/2007 | Klein | |
| 7,280,386 B2 | 10/2007 | Klein | |
| 7,522,464 B2 | 4/2009 | Yoo et al. | 365/222 |
| 7,558,142 B2 | 7/2009 | Klein | |
| 7,623,392 B2 | 11/2009 | Klein | |
| 7,742,355 B2 | 6/2010 | Kohler et al. | 365/222 |
| 7,898,892 B2 | 3/2011 | Klein | |
| 8,279,683 B2 | 10/2012 | Klein | |
| 2005/0152989 A1 | 7/2005 | Klein | |
| 2006/0013052 A1 | 1/2006 | Klein | |
| 2006/0158949 A1 | 7/2006 | Klein | |
| 2006/0158950 A1 | 7/2006 | Klein | |
| 2008/0002503 A1 | 1/2008 | Klein | |
| 2008/0151671 A1 | 6/2008 | Klein | |
| 2010/0054070 A1 | 3/2010 | Klein | |
| 2011/0134708 A1 | 6/2011 | Klein | |
| 2013/0003467 A1 | 1/2013 | Klein | |

\* cited by examiner

*Primary Examiner* — Pho M Luu
(74) *Attorney, Agent, or Firm* — Dorsey & Whitney LLP

(57) ABSTRACT

Circuits and refresh address circuits for providing a refresh address, and methods for refreshing memory cells. One such method includes refreshing a first plurality of memory cells and interrupting the refreshing of the first plurality of memory cells. A second plurality of memory cells is refreshed, at least one of the second plurality of memory cells the same as one of the first plurality of memory cells. Refreshing of the first plurality of memory cells is resumed following the refreshing of the second plurality of memory cells. One such refresh address circuit includes a refresh address counter configured to provide addresses to be refreshed and a refresh address interrupt circuit configured to interrupt the provision of addresses. An alternate refresh address circuit is configured to provide an alternate address and the refresh address counter resumes providing the addresses responsive to completing the refreshing of the alternate address.

40 Claims, 3 Drawing Sheets

Refresh Address Circuit

CIRCUITS AND METHODS FOR PROVIDING REFRESH ADDRESSES AND ALTERNATE REFRESH ADDRESSES TO BE REFRESHED

TECHNICAL FIELD

Embodiments of the present invention relate generally to memories having memory that are refreshed, and more specifically in one or more of the illustrated embodiments, to memories generating internal refresh addresses corresponding to memory to be refreshed.

BACKGROUND OF THE INVENTION

Memories may include memory cells that need to be periodically "refreshed" in order to retain the data stored. For example, with conventional volatile memory such as dynamic random access memory (DRAM), the memory cells need to be refreshed to accurately store data. In memories such as these, circuitry may be included that provide internal refresh addresses that are used to refresh the cells. As the refresh addresses are generated, the addresses are decoded and the memory corresponding to the addresses are accessed and refreshed.

For a memory to pass production testing, it must meet minimum data retention times, that is, be able to accurately store data for a minimum time. The minimum time is typically related to the maximum time the memory can go without being refreshed, according to a specification provided by the memory manufacturer. Where the maximum refresh time is longer, the minimum data retention time must be longer as well. Conversely, where refresh can occur more frequently (i.e., shorter maximum refresh time) the data retention time can be shorter.

Data retention times for the memory cells may vary due to process variations during fabrication of the memory. As a result, some memory cells may be able to store data for a longer time without being refreshed than other memory cells of the memory. In order to meet a data retention time requirement, the memory cells having the shortest data retention times, typically a minority of the overall number of memory cells, must satisfy the requirement. A memory having even a low number memory cells that cannot meet the requirement may be rejected at testing although the majority of the memory cells can meet the requirement.

Therefore, it may be desirable for a memory to refresh some memory cells more frequently than others, for example, refreshing memory cells that have relatively shorter data retention times.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
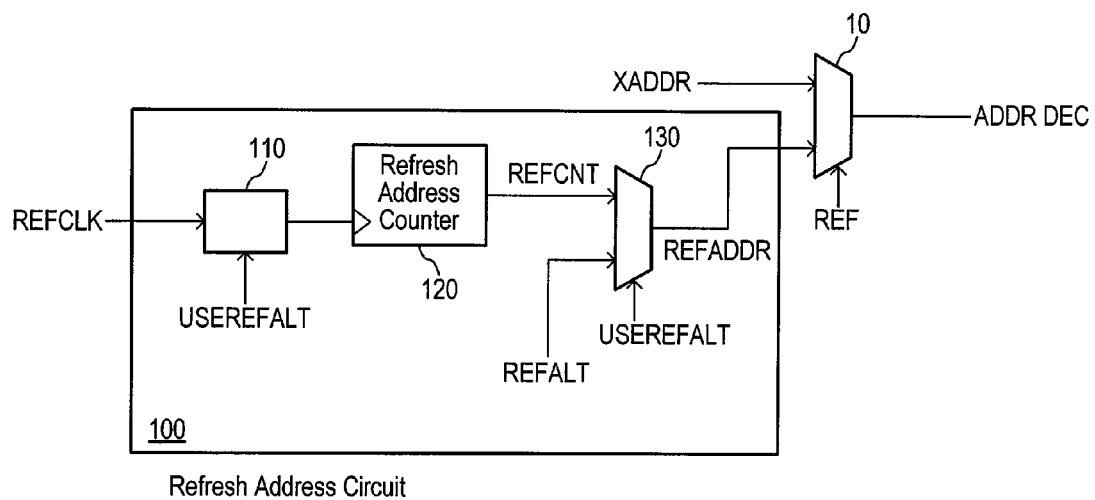
FIG. 1 is a block diagram of a refresh address circuit according to an embodiment of the invention.

FIG. 1 illustrates a refresh address circuit 100 according to an embodiment of the invention. The refresh address circuit 100 provides refresh addresses REFADDR to a multiplexer 10 that also receives external address information XADDR. The selection of which of the inputs to output as the address to be decoded ADDRDEC is controlled by a refresh signal REF. In some embodiments, the ADDRDEC addresses represent row addresses for corresponding rows of memory. The ADDRDEC addresses may also represent other groups of memory as well. The REF signal controls the multiplexer 10 to provide XADDR as ADDRDEC when a refresh operation is not being performed and controls the multiplexer 10 to provide REFADDR as ADDRDEC when a refresh operation is being performed. As the REFADDR address changes and is provided as the ADDRDEC address during a refresh operation, the memory corresponding to the REFADDR addresses may be refreshed. The generation of the REF signal is conventional, and in the interest of brevity will not be described in detail herein. The multiplexer 10 may be configured to select between and provide multi-bit REFADDR and XADDR addresses. That is, the REFADDR and XADDR addresses may be multiple bits in length.

The refresh address circuit 100 includes a refresh address counter 120 that provides a refresh address REFCNT that is incremented (or decremented in some embodiments) responsive to a refresh clock REFCLK. The REFCNT address may be a multi-bit address that changes (e.g., increases or decreases) as the refresh address counter 120 is clocked. REFCLK is provided to the refresh address counter 120 through a clock gate 110 that is responsive to an alternate refresh address enable signal USEREFALT. The refresh address REFCNT is provided to a multiplexer 130, which also receives an alternate refresh address REFALT. As will be described in more detail below, REFALT are addresses that may be refreshed more frequently than the address provided by the refresh address counter 120. The multiplexer 130 is controlled by the USEREFALT signal to output the REFCNT as REFADDR when alternate refresh addresses are not being used and to output REFALT as REFADDR when particular addresses are to be refreshed. In some embodiments, the alternate refresh addresses REFALT are provided by a circuit external to the circuit including the components illustrated in FIG. 1. Some components illustrated in FIG. 1 may be included in external circuitry as well. In other embodiments, the REFALT addresses are provided by a circuit included in the circuit having the refresh address circuit 100.

In operation, when the USEREFALT signal indicates that the alternate refresh address is not used the clock gate 110 allows REFCLK to be provided to the refresh address circuit 100 to allow it to count through refresh addresses. Additionally, the USEREFALT signal controls the multiplexer 130 to output REFCNT as REFADDR. As a result, during a refresh operation when REFADDR is provided through the multiplexer 10 as ADDRDEC, the changing (e.g., incrementing, decrementing, or other change) addresses provided by the refresh address counter 120 are decoded and the corresponding memory are refreshed accordingly. When the USEREFALT signal indicates that the alternate refresh addresses are to be used, however, the clock gate 110 blocks REFCLK from being provided to the refresh address counter 120 so that the REFCNT addresses provided by the refresh address counter 120 no longer change (e.g., increment, decrement, or other change). The multiplexer 130 is also controlled to output REFALT as the REFADDR so that those addresses are provided as the ADDRDEC addresses. As a result, the addresses identified by REFALT are refreshed rather than the addresses provided by the refresh address counter 120.

As will be further explained below, the addresses to be refreshed, that is, the addresses provided as REFADDR to the multiplexer 10, may switch from REFALT back to REFCNT, for example, upon completion of refreshing the memory corresponding to the REFALT addresses. When this occurs, the USEREFALT signal switches the multiplexer 130 and again allows the clock gate 110 to pass REFCLK to the refresh address counter 120. By interrupting the counting of the REFCNT addresses and providing the REFALT addresses to be refreshed instead, addresses (e.g., the addresses represented by REFALT addresses) may be refreshed more frequently than when provided by the refresh address counter 120.

For example, the REFCNT addresses may sequence through a set of refresh addresses having M refresh addresses, such as starting from address 0 and ending with M−1, and rolling over back to 0 when reaching the end. The REFALT addresses may be addresses in the set of refresh addresses, that is, a subset of the REFCNT addresses. The REFALT addresses may correspond to memory that has lower data retention times and should be refreshed more frequently in order to retain the stored data as long as other memory. The REFALT addresses may be refreshed more frequently than the REFCNT addresses by interrupting the refreshing of the REFCNT addresses a plurality of times during the progression through the REFCNT address cycle. For example, interrupting the REFCNT address cycle eight times to refresh the REFALT addresses results in refreshing each of the REFALT addresses roughly eight times as much as each REFCNT address in the address cycle (e.g., every P REFCNT addresses refreshed, where P=M/8 and is a non-negative whole number; wherein M=4k, the alternate refresh addresses may be refreshed every P=512 REFCNT addresses). Although the previous example has been provided to illustrate an application of the present invention to increase the frequency of refreshing the REFALT addresses, embodiments of the invention are not limited to the specific example.

Figure 2:
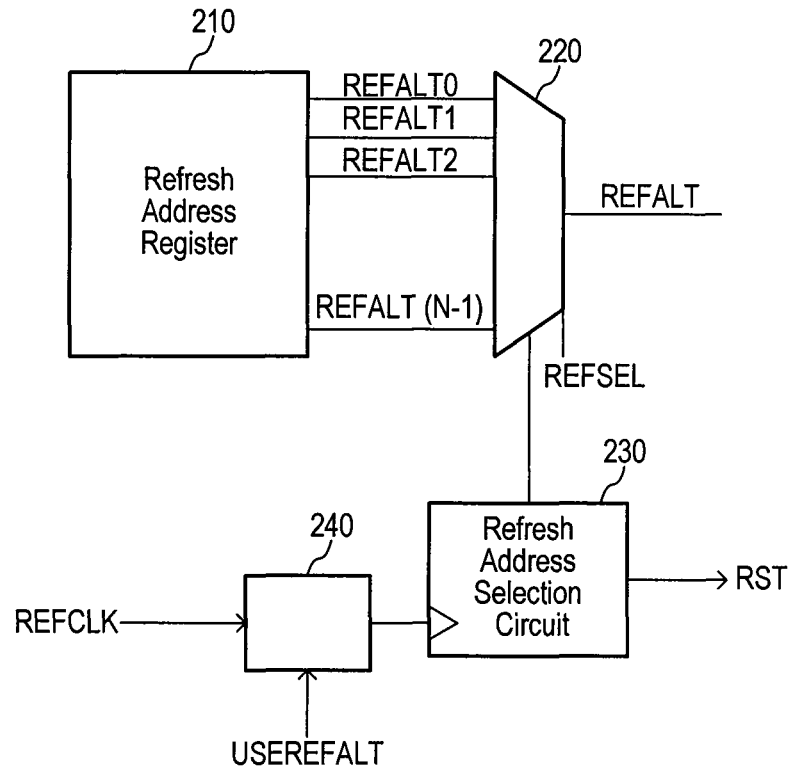
FIG. 2 is a block diagram of an alternate refresh address circuit according to an embodiment of the invention.

FIG. 2 illustrates alternate refresh address circuit 200 according to an embodiment of the invention. The alternate refresh address circuit 200 may be used with the refresh address circuit 100 of FIG. 1. The alternate refresh address circuit 200 includes a refresh address register 210 configured to store N addresses, which may be provided as N alternate refresh addresses REFALT<0:(N−1)>. In some embodiments, the refresh address register 210 stores 16 addresses. Greater or fewer addresses may be stored in other embodiments. The addresses stored by the refresh address register 210 are typically multi-bit addresses. For example, in some embodiments, each of the N addresses are 14-bits long. In other embodiments, the refresh address register 210 may store addresses of greater or fewer bits. The refresh address register 210 may include programmable elements (e.g., antifuses, fuses, non-volatile memory, or other programmable elements) that may be programmed to store the addresses. In still other embodiments, alternate refresh address register 210 may contain small ranges of row addresses. For example, the circuit might ignore Row Address bits 0 and 1 and then provide four alternate refresh addresses for one setting of the other refresh address bits.

The refresh address register 210 provides the N addresses to a multiplexer 220 that outputs one of the N addresses as REFALT responsive to a refresh address selection signal REFSEL. The REFSEL signal may be provided by a refresh address selection circuit 230. A reset signal RST is output by the refresh address selection circuit 230 after all of the refresh address have been output through the multiplexer 220. In some embodiments the refresh address selection circuit 230 is implemented as a counter circuit, however, other types of selection circuits may be used as well. In embodiments using a counter as the refresh address selection circuit 230, the counter may be clocked by REFCLK. A clock gate circuit 240 may be used to provide REFCLK to the refresh address selection circuit 230 responsive to USEREFALT. For example, when USEREFALT indicates that REFALT should be used as the refresh address REFADDR, the clock gate circuit 240 may provide REFCLK to clock the refresh address selection circuit 230, whereas when USEREFALT indicates that REFCLK should not be used as REFADDR, the clock gate circuit 240 may block REFCLK from clocking the refresh address selection circuit 230.

In operation, the REFALT0-REFALT(N−1) addresses are selectively provided by the multiplexer 220 as REFALT responsive to the REFSEL signal. For example, assuming that the refresh address register 210 stores 16 addresses, and that the refresh address selection circuit 230 is implemented as a 4-bit counter, the 4-bit count value may be used as the REFSEL signal to control the multiplexer 220 to select each of the 16 addresses stored by the refresh address register 210 by incrementing through the 16 different count values. Each time the 4-bit count value is incremented, the multiplexer 220 selects the stored address corresponding to the incremented value to be provided as the REFALT address. Addresses REFALT0-REFALT(N−1) programmed in the register may be provided by the multiplexer 220 as REFALT when the alternate addresses are to be provided as REFADDR to be refreshed instead of the addresses provided by the refresh address counter 120 (FIG. 1), for example, as indicated by the USEREFALT signal.

Figure 3:
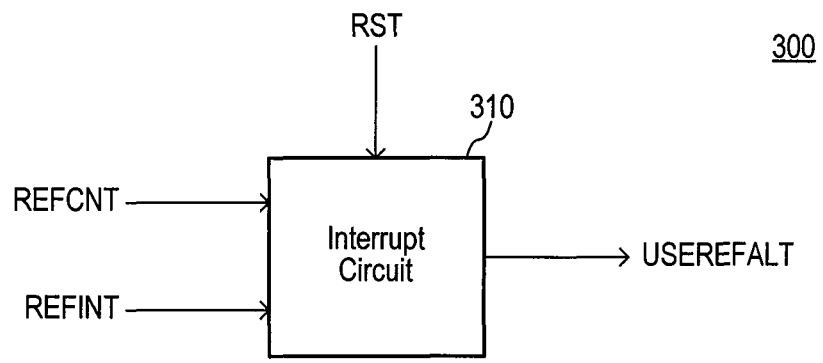
FIG. 3 is a block diagram of an interrupt circuit according to an embodiment of the invention.

FIG. 3 illustrates a refresh interrupt circuit 300 according to an embodiment of the invention. The refresh interrupt circuit 300 receives the REFCNT address and further receives an interrupt address and outputs an alternate refresh address enable signal USEREFALT. The refresh interrupt circuit 300 further receives a reset signal RST. The refresh interrupt circuit 300 includes logic that is used to generate a USEREFALT signal indicating that the alternative refresh address should be provided as the REFADDR address responsive to the REFCNT address matching the REFINT address. As previously discussed, the USEREFALT signal may be used to interrupt the counting of the REFCNT address and instead provide the REFALT addresses from an alternate refresh address circuit (e.g., the alternate refresh address circuit 200 illustrated in FIG. 2) as the REFADDR to refresh the REFALT addresses. After the REFALT addresses have been provided as the REFADDR address, the RST signal is provided to the refresh interrupt circuit 300 to generate a USEREFALT signal indicating that counting of the REFCNT address should resume and be provided as the REFADDR address to continue the refreshing of those addresses.

In some embodiments, the REFINT address is selected to interrupt the counting of the REFCNT address every P addresses, where P is a non-negative whole number. For example, the REFINT address may identify a single bit of the REFADDR such that when the particular bit is counted a match occurs and a USEREFALT signal indicating that the REFALT addresses are to be provided as the REFADDR is generated. In a particular non-limiting example, where the counting is to be interrupted after every 512 REFCNT addresses, the REFINT address may identify the eighth least significant bit as the bit to match, thus every time the bit changes from 0 to 1 or back during the REFCNT counting, the counting is interrupted. Other examples of REFINT addresses and REFCNT addresses to match may be used without departing from the scope of the invention.

Figure 4:
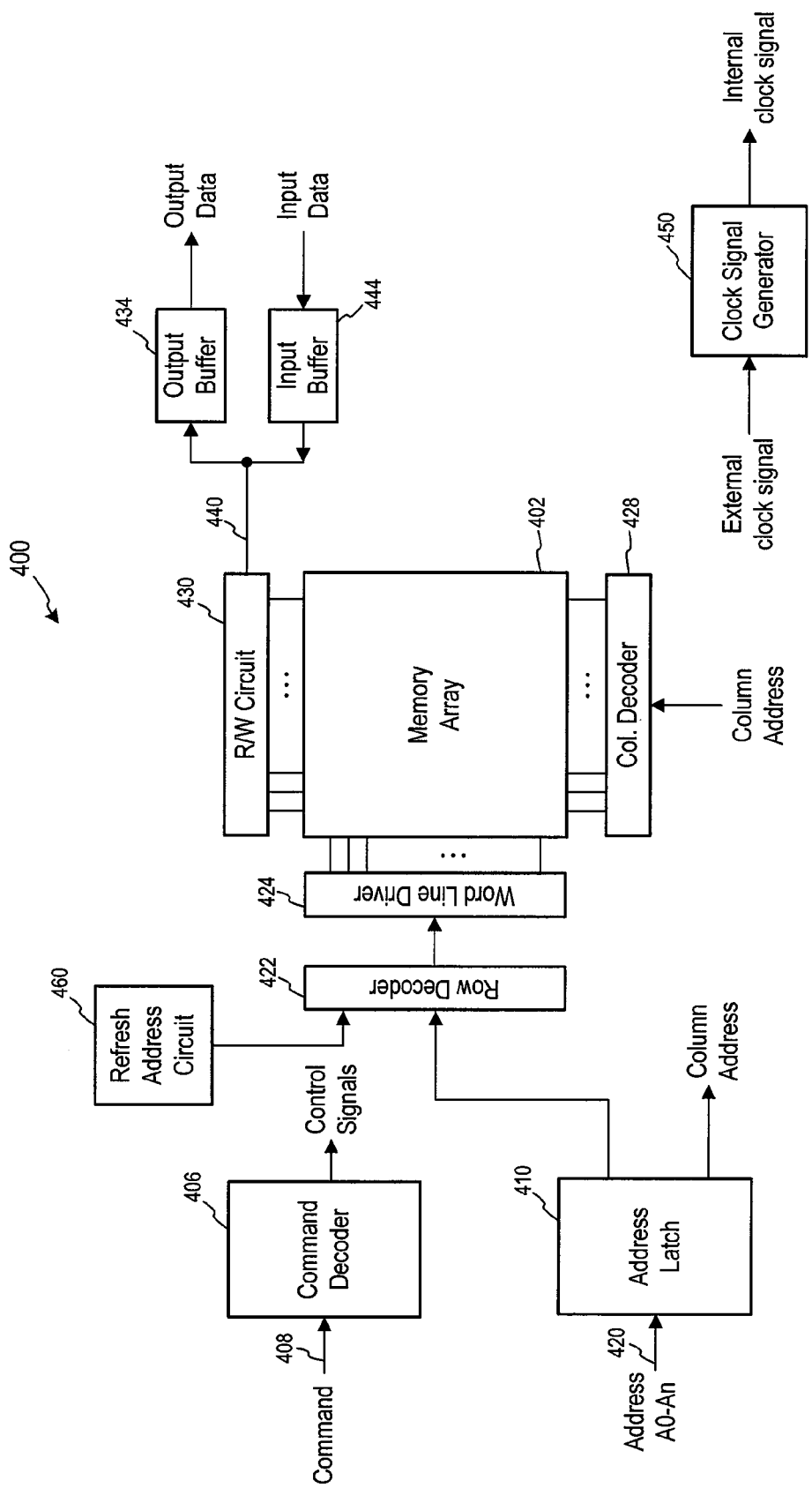
FIG. 4 is a block diagram of a memory including a refresh address circuit according to an embodiment of the invention.

FIG. 4 illustrates a portion of a memory 400 according to an embodiment of the present invention. The memory 400 includes an array 402 of memory cells, which may be, for example, DRAM memory cells, SRAM memory cells, flash memory cells, or some other types of memory cells. The memory 400 includes a command decoder 406 that receives memory commands through a command bus 408 and generates corresponding control signals within the memory 400 to carry out various memory operations. Row and column address signals are applied to the memory 400 through an address bus 420 and provided to an address latch 410. The address latch then outputs a separate column address and a separate row address.

The row and column addresses are provided by the address latch 410 to a row address decoder 422 and a column address decoder 428, respectively. The column address decoder 428 selects bit lines extending through the array 402 corresponding to respective column addresses. The row address decoder 422 is connected to word line driver 424 that activates respective rows of memory cells in the array 402 corresponding to received row addresses. The selected data line (e.g., a bit line or bit lines) corresponding to a received column address are coupled to a read/write circuitry 430 to provide read data to a data output buffer 434 via an input-output data bus 440. Write data are applied to the memory array 402 through a data input buffer 444 and the memory array read/write circuitry 430. The command decoder 406 responds to memory commands applied to the command bus 408 to perform various operations on the memory array 402. In particular, the command decoder 406 is used to generate internal control signals to read data from and write data to the memory array 402.

A refresh address circuit 460 according to an embodiment of the invention is included in the memory 400 to provide refresh addresses to the row decoder 622, which are refreshed accordingly. In operation, the refresh address circuit 460 provides refresh addresses and alternate refresh addresses to be refreshed. The alternate refresh addresses are provided following an interruption in the provision of the refresh addresses. Provision of the refresh addresses resumes following the refreshing of the alternate refresh addresses.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit for providing an address in a memory, comprising:
   a multiplexer configured to receive a memory address and a refresh address and further configured to selectively provide one of the addresses; and
   a refresh address circuit coupled to the multiplexer and configured to provide the refresh address thereto, the refresh address circuit configured to provide refresh addresses to refresh at least one refresh address with greater frequency than other refresh addresses by interrupting the provision of refresh addresses from a set of refresh addresses and instead provide alternate refresh addresses, and resuming the provision of the refresh addresses from the set of refresh addresses after the alternate refresh addresses are provided.

2. The circuit of claim 1 wherein the refresh address circuit is configured to provide one of a plurality of refresh addresses or at least one alternate refresh address as the refresh address, the at least one alternate refresh address provided by the refresh address circuit responsive to an interruption in providing the one of a sequence of refresh addresses.

3. The circuit of claim 2 wherein the refresh address circuit comprises:
   a counter configured to increment through a plurality of refresh addresses.

4. The circuit of claim 3, wherein the refresh address circuit further comprises:
   a refresh address interruption circuit coupled to the counter and configured to interrupt the counter; and
   a register configured to provide an alternate refresh address during interruption of the counter.

5. The circuit of claim 1 wherein the alternate refresh addresses are provided from an external circuit.

6. The circuit of claim 1 wherein the refresh address circuit is configured to provide the at least one refresh address refreshed with greater frequency every P refresh addresses provided, P a non-negative, whole number.

7. The circuit of claim 1 wherein the refresh address circuit is configured to provide the at least one refresh address refreshed with greater frequency to refresh the at least one refresh address at least twice as frequently as the other refresh addresses.

8. The circuit of claim 1 wherein the refresh addresses to refresh at least one refresh address with greater frequency than other refresh addresses corresponds to memory having shorter memory storage performance than the memory cells corresponding to the other refresh addresses.

9. A refresh address circuit, comprising:
   a refresh address counter configured to provide refresh addresses to be refreshed;
   a refresh address interrupt circuit coupled to the refresh address counter and configured to interrupt the refresh address counter providing the refresh address; and
   an alternate refresh address circuit configured to provide an alternate refresh address to be refreshed during the interruption, the alternate refresh address circuit including a register configured to store at least one alternate refresh address,
   the refresh address counter further configured to resume providing the refresh addresses responsive to completing the refreshing of the alternate refresh address.

10. The refresh address circuit of claim 9 wherein the refresh address counter is configured to increment through a plurality of refresh addresses and provide the same to be refreshed.

11. The refresh address circuit of claim 9 wherein the alternate refresh address circuit is configured to provide an alternate refresh address that is the same as one of the refresh addresses provided by the refresh address counter.

12. The refresh address circuit of claim 9 wherein the register comprises at least one anti-fuse.

13. The refresh address circuit of claim 9 wherein the refresh address interrupt circuit is configured to interrupt the refresh address counter every P addresses provided, where P is a non-negative, whole number.

14. The refresh address circuit of claim 9 wherein the alternate refresh address circuit is configured to ignore bits of a row address and provide substitute alternate bits for the ignored bits to provide the alternate refresh address.

15. A memory, comprising:
  memory configured to store data;
  an address decoder configured to decode an address and access the memory corresponding to the decoded address; and
  a refresh address circuit coupled to the address decoder and configured to provide refresh addresses to be decoded and the corresponding memory accessed thereby refreshing the accessed memory; the refresh address circuit comprising:
    a refresh address counter configured to provide refresh addresses to be refreshed;
    a refresh address interrupt circuit coupled to the refresh address counter and configured to interrupt the refresh address counter providing the refresh address; and
    an alternate refresh address circuit configured to provide an alternate refresh address to be refreshed during the interruption,
    the refresh address counter further configured to resume providing the refresh addresses responsive to completing the refreshing of the alternate refresh address.

16. A method for refreshing memory cells, comprising:
  refreshing a first plurality of memory cells;
  interrupting the refreshing of the first plurality of memory cells;
  refreshing a second plurality of memory cells, at least one of the second plurality of memory cells the same as one of the first plurality of memory cells; and
  resuming the refreshing of the first plurality of memory cells following the refreshing of the second plurality of memory cells.

17. The method of claim 16 wherein refreshing the first plurality of memory cells comprises:
  refreshing the first plurality of memory cells row by row.

18. The method of claim 16 wherein refreshing the first plurality of memory cells comprises:
  refreshing memory cells corresponding to a current refresh address;
  incrementing the current refresh address to provide a new current refresh address; and
  repeating the refreshing and incrementing.

19. The method of claim 16 wherein refreshing the first plurality of memory cells comprises:
  refreshing memory cells corresponding to an incrementing refresh address; and
  wherein interrupting the refreshing of the plurality of memory cells, comprises:
  interrupting the refreshing of the plurality of memory cells after the memory cells of every P refresh addresses are refreshed, P being a non-negative and whole number.

20. The method of claim 16 wherein the second plurality of memory cells comprises a subset of memory cells included in the first plurality of memory cells.

21. The method of claim 16 wherein refreshing a first plurality of memory cells comprises refreshing memory cells corresponding to a set of refresh addresses.

22. The method of claim 21 wherein refreshing memory cells corresponding to a set of refresh addresses comprises:
  incrementing through the set of refresh addresses and refreshing the memory cells corresponding to a current refresh address.

23. The method of claim 22 wherein interrupting the refreshing of the plurality of memory cells comprises interrupting the refreshing of the plurality of memory cells before all the memory cells corresponding to the set of refresh addresses are refreshed.

24. A method of refreshing memory cells, comprising:
  refreshing a group of memory cells; and
  refreshing a subset of memory cells of the group of memory cells more frequently than other memory cells of the group by interrupting the refreshing of the group of memory cells refreshing the subset of memory cells, and resuming the refreshing of the group of memory cells.

25. The method of claim 24 wherein the group of memory cells is evenly divided into sub-groups of memory cells and interrupting the refreshing of the group of memory cells comprises interrupting the refreshing after completing the refreshing of every sub-group of memory cells.

26. The method of claim 24 wherein refreshing the subset of memory cells of the group of memory cells more frequently comprises:
  refreshing memory cells corresponding to a set of alternate refresh addresses more frequently.

27. The method of claim 26 wherein the set of alternate refresh addresses are stored in a register.

28. The method of claim 26 wherein the set of alternate refresh addresses comprise a range of row addresses stored in a register.

29. The method of claim 24 wherein refreshing the group of memory cells comprises refreshing the group of memory cells on a row by row basis.

30. A refresh address circuit, comprising:
  a refresh address counter configured to provide refresh addresses to be refreshed;
  a refresh address interrupt circuit coupled to the refresh address counter and configured to interrupt the refresh address counter providing the refresh address; and
  an alternate refresh address circuit configured to provide an alternate refresh address to be refreshed during the interruption and further configured to ignore bits of a row address and provide substitute alternate bits for the ignored bits to provide the alternate refresh address,
  the refresh address counter further configured to resume providing the refresh addresses responsive to completing the refreshing of the alternate refresh address.

31. An apparatus, comprising:
  a refresh address counter configured to provide a plurality of refresh addresses;
  a refresh address interrupt circuit coupled to the refresh address counter and configured to interrupt the refresh address counter providing the plurality of refresh addresses; and
  an alternate refresh address circuit coupled to the refresh address interrupt circuit and configured to provide at least one alternate address responsive, at least in part, to the refresh address interrupt circuit interrupting the refresh address counter, 32. The apparatus of claim 31, wherein the plurality of refresh addresses includes the at least one alternate address.

33. The apparatus of claim 31, wherein the at least one alternate address comprises a range of row addresses.

34. The apparatus of claim 31, wherein the refresh address interrupt circuit is configured to interrupt the refresh address counter responsive, at least in part, to the refresh address counter providing a number of the plurality of refresh addresses.

35. The apparatus of claim 31, wherein the refresh address interrupt circuit is configured to interrupt the refresh address counter by preventing a clock gate from passing a reference clock signal.

36. The apparatus of claim 31, wherein the refresh address counter is configured to provide the plurality of refresh addresses based, at least in part, on a reference clock signal.

37. An apparatus, comprising:
- a refresh address circuit configured to selectively provide first and second pluralities of refresh addresses, the refresh address circuit configured to provide refresh addresses of the first plurality of refresh addresses at a first frequency and to provide refresh addresses of the second plurality of refreshes at a second frequency different than the first frequency,
- wherein the refresh address circuit is further configured to interrupt the provision of the first plurality of refresh addresses to provide a refresh address of the second plurality of refresh addresses and to resume provision of the first plurality of refresh addresses responsive, at least in part, to providing the refresh address of the second plurality of refresh addresses.

38. The apparatus of claim 37, further comprising: a refresh address register configured to store the second plurality of refresh addresses and to provide the second plurality of refresh addresses to the refresh address circuit based, at least in part, on a selection control signal.

39. The apparatus of claim 38, wherein the refresh address register comprises a plurality of programmable elements.

40. The apparatus of claim 37, wherein the first plurality of refresh addresses and the second plurality of refresh addresses include a same refresh address.

* * * * *

UNITED STATES PATENT AND TRADEMARK OFFICE
CERTIFICATE OF CORRECTION

| | | |
|---|---|---|
| PATENT NO. | : 8,630,141 B2 | Page 1 of 1 |
| APPLICATION NO. | : 13/016657 | |
| DATED | : January 14, 2014 | |
| INVENTOR(S) | : Robert Tamlyn | |

It is certified that error appears in the above-identified patent and that said Letters Patent is hereby corrected as shown below:

On the title page, item (56), under "U.S. Patent Documents", in column 2, line 10, delete "2005/0152989 A1 7/2005" and insert -- 2006/0152989 A1 7/2006 --, therefor.

In the Claims

In column 7, line 32, in Claim 16, delete "cells," and insert -- cells. --, therefor.

In column 8, line 54, in Claim 31, delete "counter," and insert -- counter. --, therefor.

In column 9, line 3, in Claim 36, delete "signal," and insert -- signal. --, therefor.

Signed and Sealed this
Twenty-fifth Day of March, 2014

Michelle K. Lee
*Deputy Director of the United States Patent and Trademark Office*